(12) United States Patent
Ui

(10) Patent No.: US 8,581,665 B2
(45) Date of Patent: Nov. 12, 2013

(54) DOHERTY AMPLIFIER

(75) Inventor: Norihiko Ui, Kanagawa (JP)

(73) Assignee: Sumitomi Electric Device Innovations, Inc., Yokohama-shi, Kanagawa (JP)

(*) Notice: Subject to any disclaimer, the term of this patent is extended or adjusted under 35 U.S.C. 154(b) by 0 days.

(21) Appl. No.: 13/191,043

(22) Filed: Jul. 26, 2011

(65) Prior Publication Data

US 2012/0025915 A1 Feb. 2, 2012

(30) Foreign Application Priority Data

Jul. 27, 2010 (JP) ................................. 2010-168632

(51) Int. Cl.
*H03F 3/68* (2006.01)

(52) U.S. Cl.
USPC ........................ 330/295; 330/124 R

(58) Field of Classification Search
USPC ........................... 330/295, 124 R, 286, 84, 53
See application file for complete search history.

(56) References Cited

U.S. PATENT DOCUMENTS

| | | | |
|---|---|---|---|
| 7,262,656 B2* | 8/2007 | Shiikuma | 330/124 R |
| 7,646,248 B2* | 1/2010 | Yang et al. | 330/295 |
| 7,764,120 B2* | 7/2010 | Pengelly | 330/124 R |
| 2011/0140775 A1* | 6/2011 | Hong et al. | 330/124 R |
| 2011/0175677 A1* | 7/2011 | Jeong et al. | 330/124 R |

FOREIGN PATENT DOCUMENTS

JP 2005-322993 A 11/2005

OTHER PUBLICATIONS

Ho, Tommy, "A 900 MHz, 200 W Silicon LDMOS Power Amplifier Using Integrated Passive Devices in a New Over-Molded Plastic Package", RF Division, Freescale Semiconductors, 2100 E. Elliot Road, Tempe, AZ 85284, IEEE, 2009, pp. 1269-1272.

* cited by examiner

*Primary Examiner* — Hieu Nguyen
(74) *Attorney, Agent, or Firm* — Westerman, Hattori, Daniels & Adrian, LLP

(57) ABSTRACT

A Doherty amplifier includes: an input distributor; a coupler; a plurality of Doherty circuit connected between the input distributor and the coupler; wherein each of Doherty circuits has a carrier amplifier, a peaking amplifier, a distributor distributing a input signal to the carrier amplifier and the peaking amplifier, and a combiner that transforms an output impedance of the carrier amplifier and combines outputs of the carrier amplifier and the peaking amplifier.

14 Claims, 11 Drawing Sheets

DOHERTY AMPLIFIER

CROSS-REFERENCE TO RELATED APPLICATION

This application is based upon and claims the benefit of priority of the prior Japanese Patent Application No. 2010-168632 filed on Jul. 27, 2010, the entire contents of which are incorporated herein by reference.

BACKGROUND (i) Technical Field

A certain aspect of the embodiments discussed herein is related to a Doherty amplifier. Another aspect of the embodiments is related to a Doherty amplifier having a plurality of Doherty circuits.

(ii) Related Art

A Doherty amplifier is used as radio communications amplifier (see Japanese Patent Application Publication No. 2005-322993). The Doherty amplifier includes a carrier amplifier and a peaking amplifier. The carrier amplifier is an amplifier that primarily amplifies an input signal. The peaking amplifier is an amplifier that amplifies the peak of the input signal. For example, the carrier amplifier always amplifies the input signal. In contrast, the peaking amplifier amplifies the input signal only when the input signal has power equal to or higher than a predetermined level.

The Doherty amplifier is desired to operate in a broader band.

SUMMARY

According to an aspect of the present invention, there is provided a Doherty amplifier including: an input distributor; a coupler; a plurality of Doherty circuit connected between the input distributor and the coupler; wherein each of Doherty circuits has a carrier amplifier, a peaking amplifier, a distributor distributing a input signal to the carrier amplifier and the peaking amplifier, and a combiner that transforms an output impedance of the carrier amplifier and combines outputs of the carrier amplifier and the peaking amplifier.

DETAILED DESCRIPTION

Embodiments of the present invention are described below with reference to the accompanying drawings.

(First Embodiment)

Figure 1:
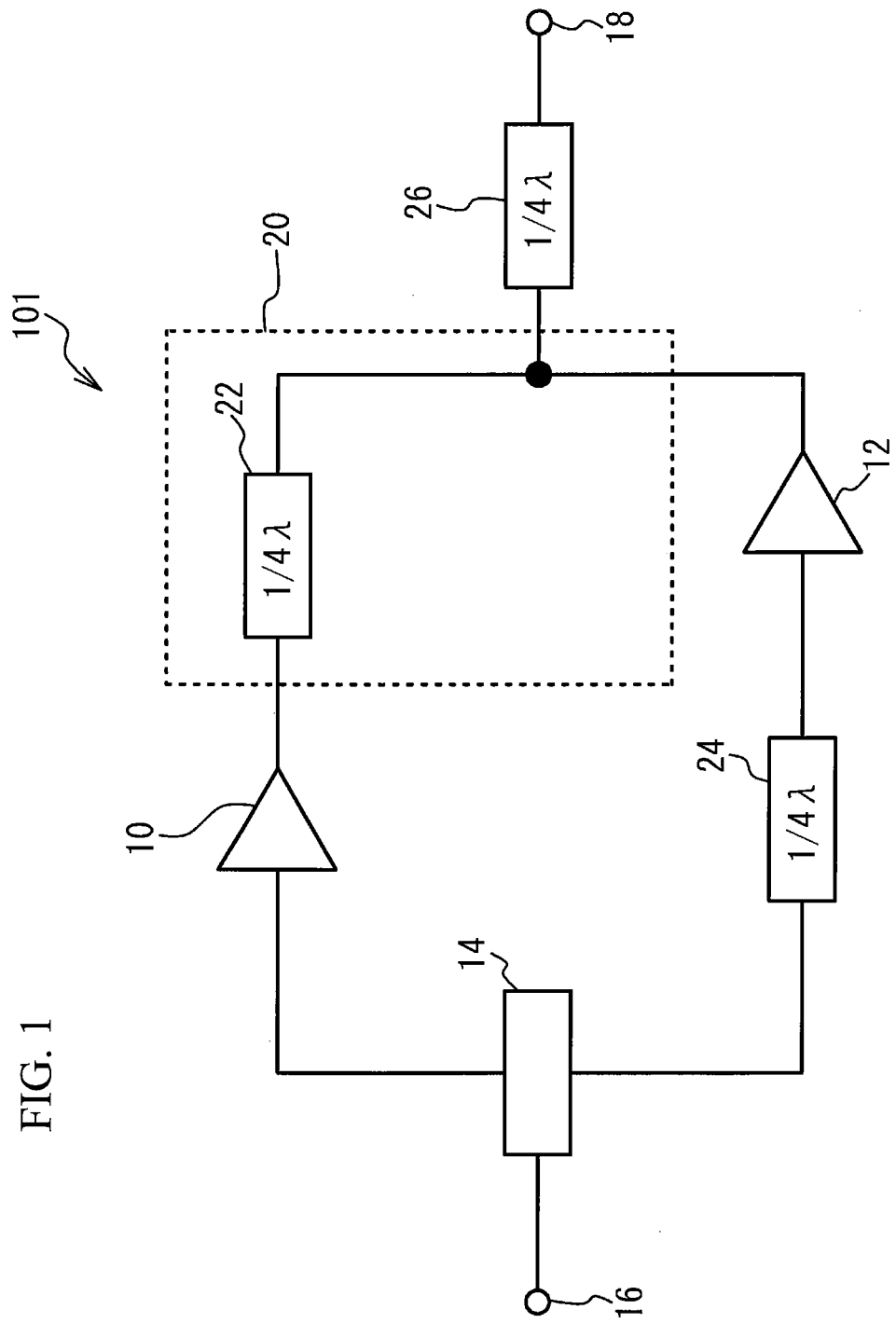
FIG. 1 is a circuit diagram of a Doherty amplifier.

First, a Doherty amplifier is described. FIG. 1 is a circuit diagram of a Doherty amplifier. A Doherty amplifier 101 includes a carrier amplifier 10, a peaking amplifier 12, a distributor 14 and a combiner 20. The distributor 14 distributes an input signal applied to an input terminal 16 to two paths. For example, the distributor 14 equally distributes the input signal to two signals. The carrier amplifier 10 receives one of the two input signals and amplifies the input signal. The peaking amplifier 12 receives the other input signal and amplifies it. The combiner 20 has a node at which the output signal of the carrier amplifier 10 and that of the peaking amplifier 12 are combined, and a $\lambda/4$ phase line 22 (an impedance transformer) where $\lambda$ is the wavelength of the input signal. The $\lambda/4$ phase line 22 is connected to a next stage of the carrier amplifier 10. The $\lambda/4$ phase line 26 is connected to the next stage of the node at which the outputs of the carrier amplifier 10 and the peaking amplifier 12 are combined. The combiner 20 adjusts the impedances of the outputs of the carrier amplifier 10 and the peaking amplifier 12, and combines the output signals thereof. The signal output by the combiner 20 is output via an output terminal 18. A $\lambda/4$ phase line 24 (a phase compensator) is connected to the preceding stage of the peaking amplifier 12.

The $\lambda/4$ phase line 22 performs an impedance transformation so that the load connected to the output of the carrier amplifier 10 is twice the load connected to the output terminal 18 when power is as low as only the carrier amplifier 10 operates. In contrast, when power is as high as both the carrier amplifier 10 and the peaking amplifier 12 operate, the $\lambda/4$ phase line 22 performs an impedance transformation so that the load connected to the outputs of the carrier amplifier 10 and the peaking amplifier 12 is equal to that connected to the output terminal 18. The $\lambda/4$ phase line 24 is a line intended to compensate for a phase difference between the carrier amplifier 10 and the peaking amplifier 12 due to the $\lambda/4$ phase line 22 associated with the carrier amplifier 10. The $\lambda/4$ phase line 24 matches the impedance of the node at which the outputs of the carrier amplifier 10 and the peaking amplifier 12 are combined with the characteristic of the next stage.

The carrier amplifier 10 is, for example, a class-A or class-AB amplifier, and always amplifies the distributed signal from the distributor 14. The peaking amplifier 12 is, for example, a class-C amplifier, and amplifies the distributed signal that has a power higher than a predetermined power.

Figure 2:
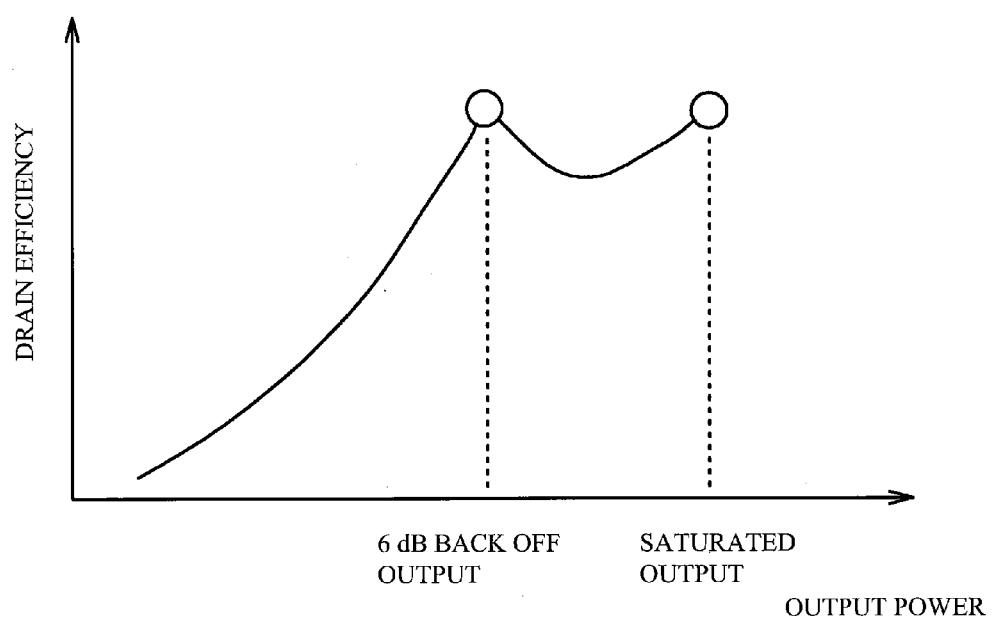
FIG. 2 is a graph of the drain efficiency associated with the output power of the Doherty amplifier.

FIG. 2 is a graph that illustrates the drain efficiency associated with the output power of the Doherty amplifier. Referring to FIG. 2, when the output power is saturated, the carrier amplifier 10 and the peaking amplifier 12 have respective saturated powers. Thus, the drain efficiency is maximized. At an output that is 6 dB lower than the saturated power (6 dB back-off output), only the carrier amplifier 10 has the saturated power, and the peaking amplifier 12 does not amplify the signal. This case also has the maximum drain efficiency. Since the drain efficiency is maximized at two output powers, it is possible to obtain a wide range of output power having high drain efficiencies. For example, in many cases, power amplifiers for digital modulation signals are operated at an output power that is 5 dB~8 dB lower than the saturated power in order to maintain the linearity. The Doherty amplifier is capable of improving the drain efficiency at back-off powers, as illustrated in FIG. 2.

In a case where the carrier amplifier 10 and the peaking amplifier 12 have an identical size, the load connected when only the carrier amplifier 10 operates is twice the load connected when both the carrier amplifier 10 and the peaking amplifier 12 operate. Thus, when only the carrier amplifier 10 operates, the amplifier size and current are halves those obtained when both the carrier amplifier 10 and the peaking amplifier 12 operate, and the output power is ¼. Thus, as illustrated in FIG. 2, the output power obtained when only the carrier amplifier 10 operates is 6 dB (¼) lower than that obtained when both the carrier amplifier 10 and the peaking amplifier 12 operate. By changing the sizes of the carrier amplifier 10 and the peaking amplifier 12 from the ratio of 1:1, it is possible to change the peak of the drain efficiency from the 6 dB back-off output.

Figure 3:
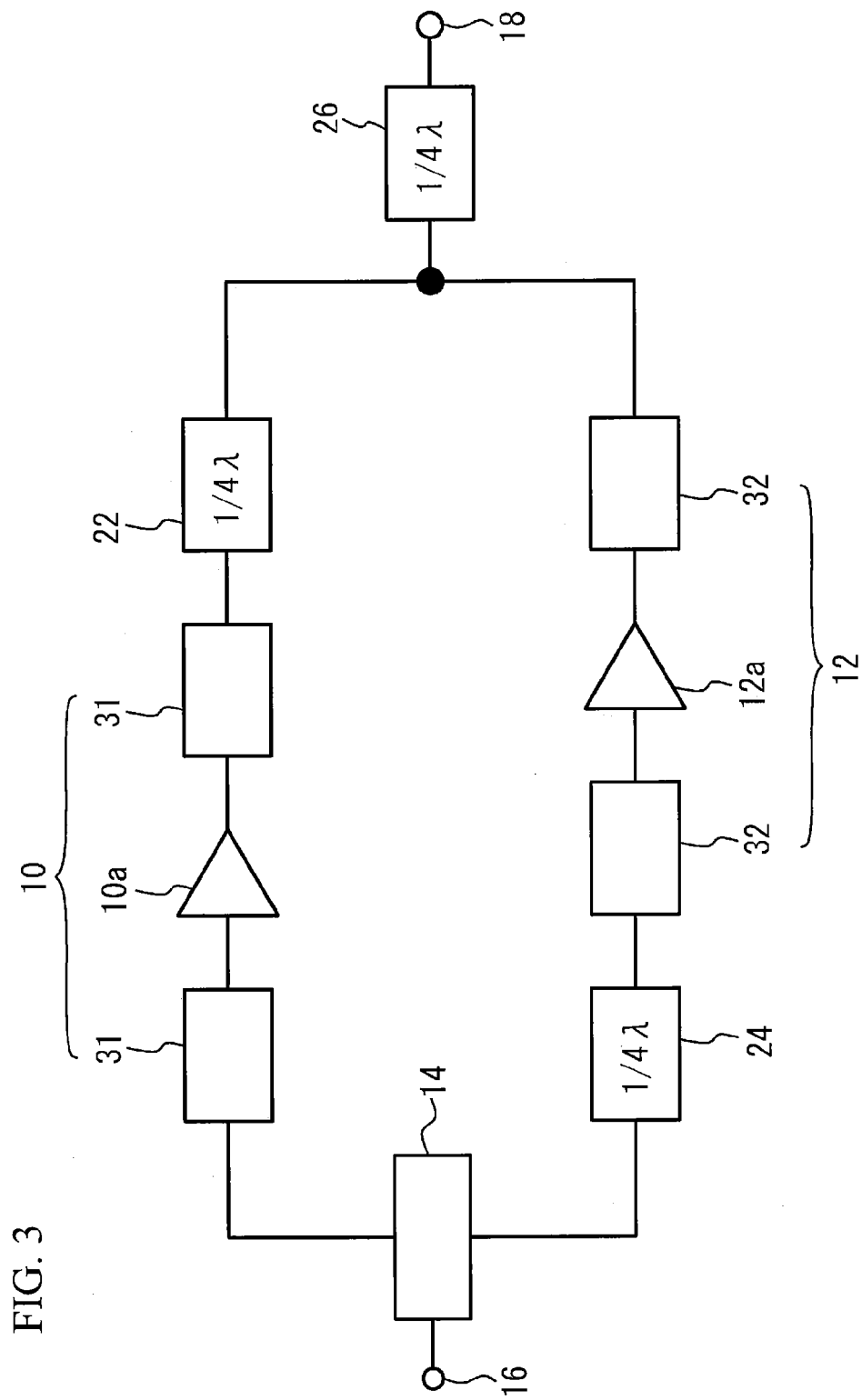
FIG. 3 is a circuit diagram of the Doherty amplifier illustrated in FIG. 1.

FIG. 3 is a circuit diagram of the Doherty amplifier illustrated in FIG. 1. Referring to FIG. 3, the carrier amplifier 10 is composed of matching circuits 31 and a carrier amplifier 10a. The matching circuits 31 may match the input and output impedances of the carrier amplifier 10a with the characteristic impedance of the transmission line, for example. The peaking amplifier 12 is composed of matching circuits 32 and a peaking amplifier 12a. The matching circuits 32 match the input and output impedances of the peaking circuit 12a with the characteristic impedance of the transmission line. In a case where the output impedance of the carrier amplifier 10a and that of the peaking amplifier 12a are 5 Ω, the matching circuits 31 and 32 at the output sides match the outputs of the carrier amplifier 10a and the peaking amplifier 12a with a characteristic of impedance of 50 Ω of the transmission line. The carrier amplifier 10a and the peaking amplifier 12a may be FETs (Field Effect Transistors). The other structures of the circuit illustrated in FIG. 3 are the same as those illustrated in FIG. 1, and a description thereof is omitted here.

The Doherty amplifier illustrated in FIG. 3 has a difficulty in broadening the operable band. This is because the λ/4 phase lines 22, 24 and 26 have large reactance components and greatly depend on the frequency. Thus, a change of the frequency of the input signal may make it difficult to obtain the desired characteristics and broaden the band.

Figure 4:
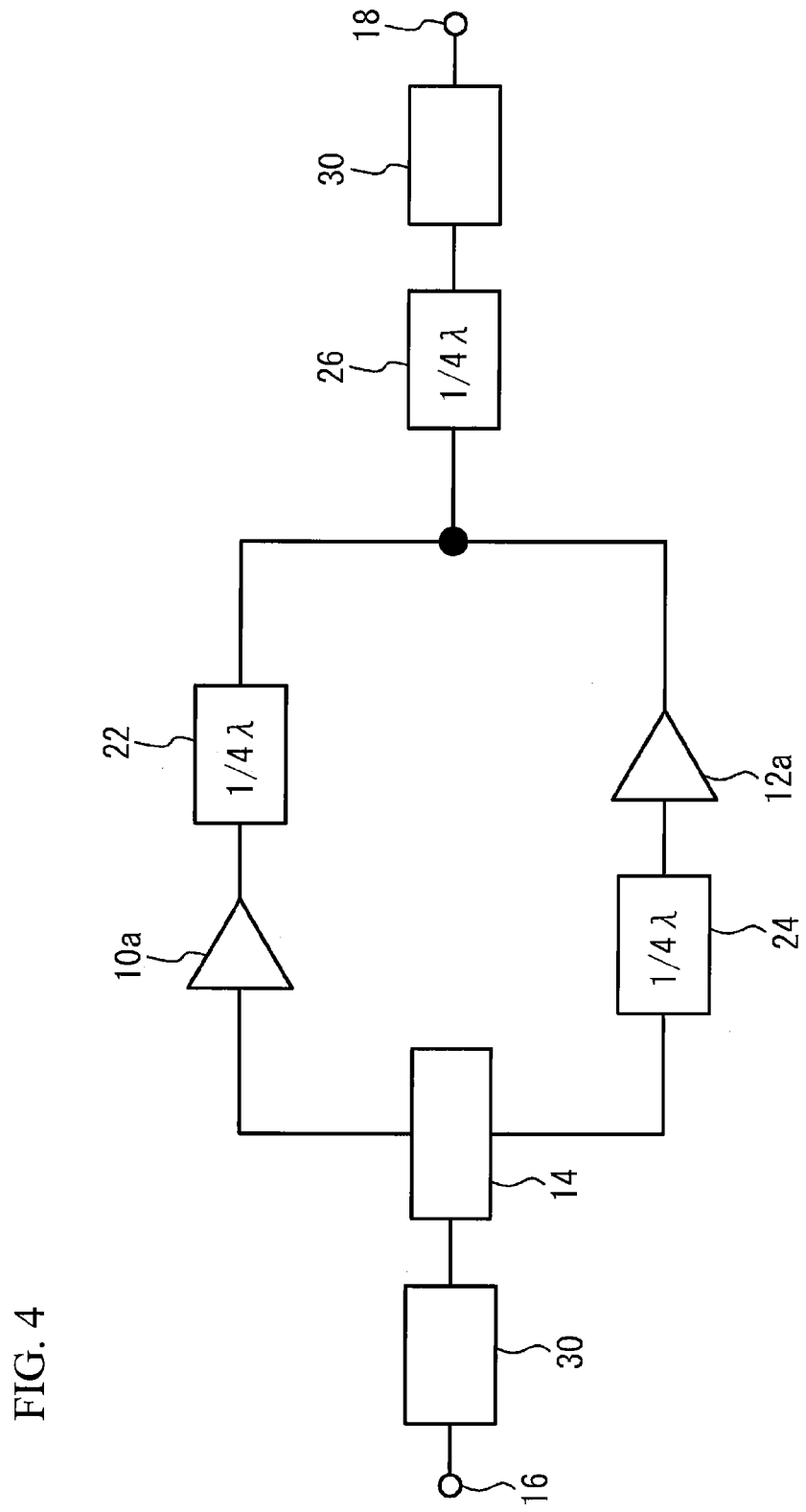
FIG. 4 is a circuit diagram of a Doherty amplifier in accordance with a comparative example.

FIG. 4 is a circuit diagram of a Doherty amplifier in accordance with a comparative example. The Doherty amplifier illustrated in FIG. 4 differs from that in FIG. 3 in that one matching circuit 30 is provided between the input terminal 16 and the distributor 14, and another matching circuit 30 is provided between the λ/4 phase line 26 and the output terminal 18. The λ/4 phase lines 22, 24 and 26, which are sensitive to the frequency, are provided closer to the carrier amplifier 10a and the peaking amplifier 12a than the matching circuits 30. It is thus possible to broaden the band.

However, for an FET using GaN and having an output power of 100 W, the output impedance is 5 Ω. In a case where this FET is used for the carrier amplifier 10a and the peaking amplifier 12a, the λ/4 phase line 22 is formed by a line having a characteristic impedance of 5 Ω. In an exemplary case where ceramic having a dielectric constant of 90 and having a film thickness of 0.5 mm, a λ/4 phase line for a signal of 2.1 GHz has a width of 4 mm and a length of 4 mm. In another exemplary case where a PCB (Printed Circuit Board) having a dielectric constant of 3.2 and a thickness of 0.8 mm is used, a λ/4 phase line for a signal of 2.1 GHz has a width of 30 mm and a length of 20 nm. An increasing width of the line leads to a difficulty in layout.

Taking the above into consideration, a first embodiment is configured to divide the carrier amplifier 10a into parts and divide the peaking amplifiers 12a into parts. For example, the carrier amplifier 10a is divided into 10, and the peaking amplifier 12a is divided into 10. Thus, each of 10 carrier amplifiers 10b has an output impedance of 50 Ω, and each of 10 peaking amplifiers 12b has an output impedance of 50 Ω. Thus, the λ/4 phase line can be realized by using a line having a characteristic impedance of 50 Ω. For an exemplary case where the dielectric constant is 10 and the film thickness is 0.25 mm, the λ/4 phase line for the 2.1 GHz signal has a width of 0.24 mm and a length of 14 mm. The output impedance may be 20~100 Ω, for example.

Figure 5:
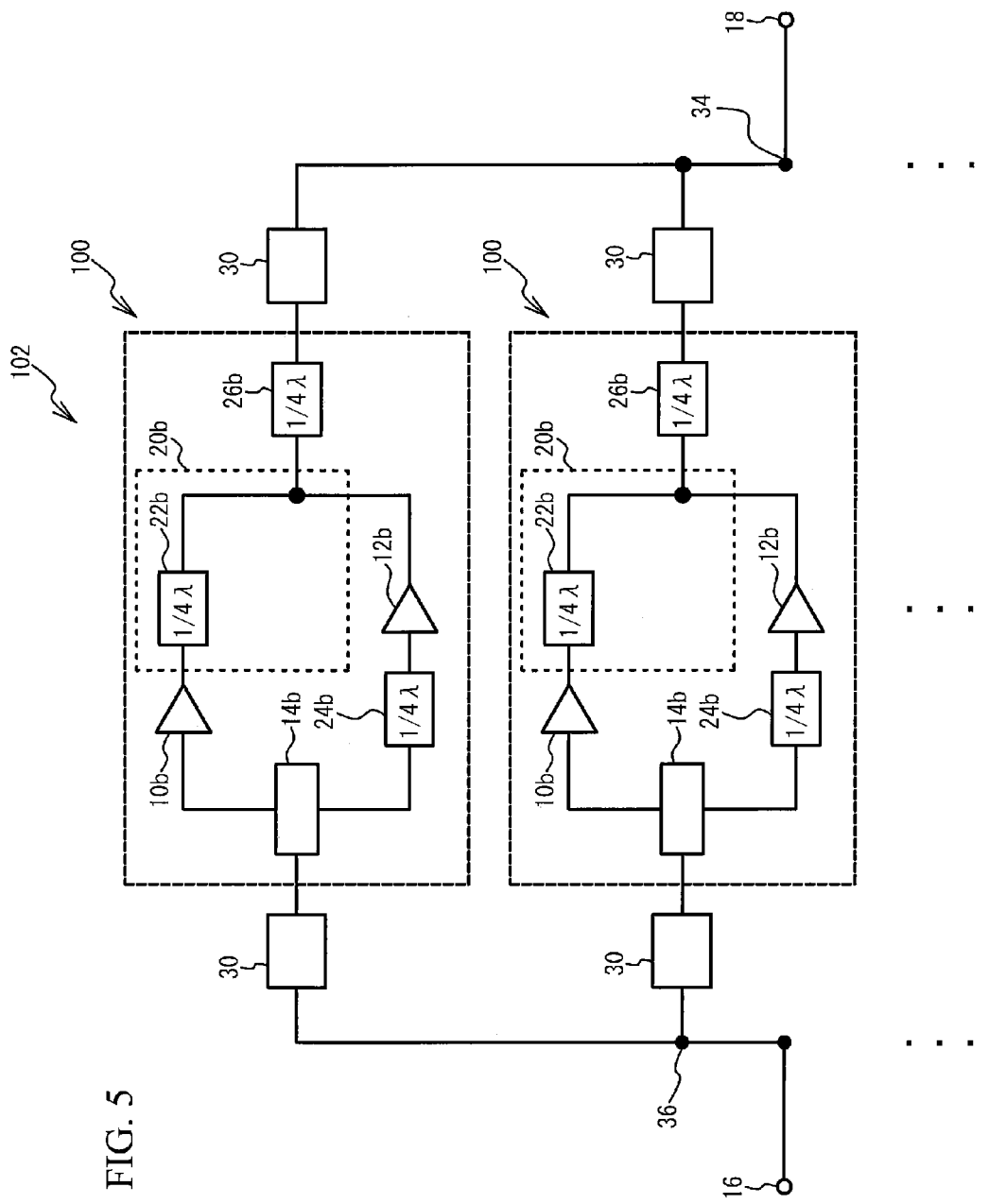
FIG. 5 is a circuit diagram of a Doherty amplifier in accordance with a first embodiment.

FIG. 5 is a circuit diagram of a Doherty amplifier in accordance with the first embodiment. Referring to FIG. 5, a Doherty amplifier 102 has a plurality of Doherty circuits 100 connected in parallel. A coupler 34 combines the outputs of the Doherty circuits 100 and outputs a combined output signal to the output terminal 18. An input distributor 36 distributes the input signal applied to the input terminal 16 to paths respectively including the Doherty circuits 100. In the first embodiment, the coupler 34 is a node that is connected in common to the outputs of the Doherty circuits 100. The input distributor 36 is a node that is connected in common to the inputs of the Doherty circuits 100.

Each of the Doherty circuits 100 includes a distributor 14b, one carrier amplifier 10b, one peaking amplifier 12b and a combiner 20b. The distributor 14b distributes the input signal distributed by the input distributor 36 to two signals. The carrier amplifier 10b receives one of the two signals and amplifies it. The peaking amplifier 12b receives the other signal and amplifies the peak thereof. The combiner 20b includes a λ/4 phase line 22b (an impedance transformer), transforms the impedance of the output of the carrier amplifier 10b, and combines the output signal of the carrier amplifier 10b and that of the peaking amplifier 12b. The λ/4 phase line 22b of the combiner 20b is connected to the next stage of the carrier amplifier 10b, and transforms the impedance before the output signal of the carrier amplifier 10b is combined with that of the peaking amplifier 12b. A λ/4 phase line 24b (a phase compensator) is connected to the preceding stage of the peaking amplifier 12b. A λ/4 phase line 26b is connected to the next stage of the node at which the output of the carrier amplifier 10b and that of the peaking amplifier 12b are combined together.

Matching circuits 30 are respectively provided between the input distributor 36 and the Doherty circuits 100, and are respectively provided between the Doherty circuits 100 and the coupler 34. The matching circuits 30 may be provided between the input terminal 16 and the input distributor 36 and between the coupler 34 and the output terminal 18. The input distributor 36 may have the matching circuits 30, and the coupler 34 may have the matching circuits 30.

According to the first embodiment, the Doherty amplifier 102 includes the input distributor 36 configured to distribute the input signal to the multiple signals, the Doherty circuits 100, and the coupler 34 configured to combine the outputs of the Doherty circuits 100. It is thus possible to broaden the band of the Doherty amplifier 102.

The first embodiment has the matching circuits 30 that are provided at the next stages of the combiners 20b and match the output impedances of the Doherty circuits 100 with the output impedance of the Doherty amplifier 102. As described above, since the combiners 20b are located at the stages before the matching circuits 30, it is possible to locate the λ/4 phase lines 22b, 24b and 26b, which are sensitive to the frequency, in the positions closer to the carrier amplifier 10b and the peaking amplifier 12b than the matching circuits 30. It is thus possible to broaden the bands of the Doherty circuits 100. Since the carrier amplifier 10b and the peaking amplifier 12b have increased output impedances, the λ/4 phase lines 22b, 24b and 26b may be downsized.

(Second Embodiment)

Figure 6:
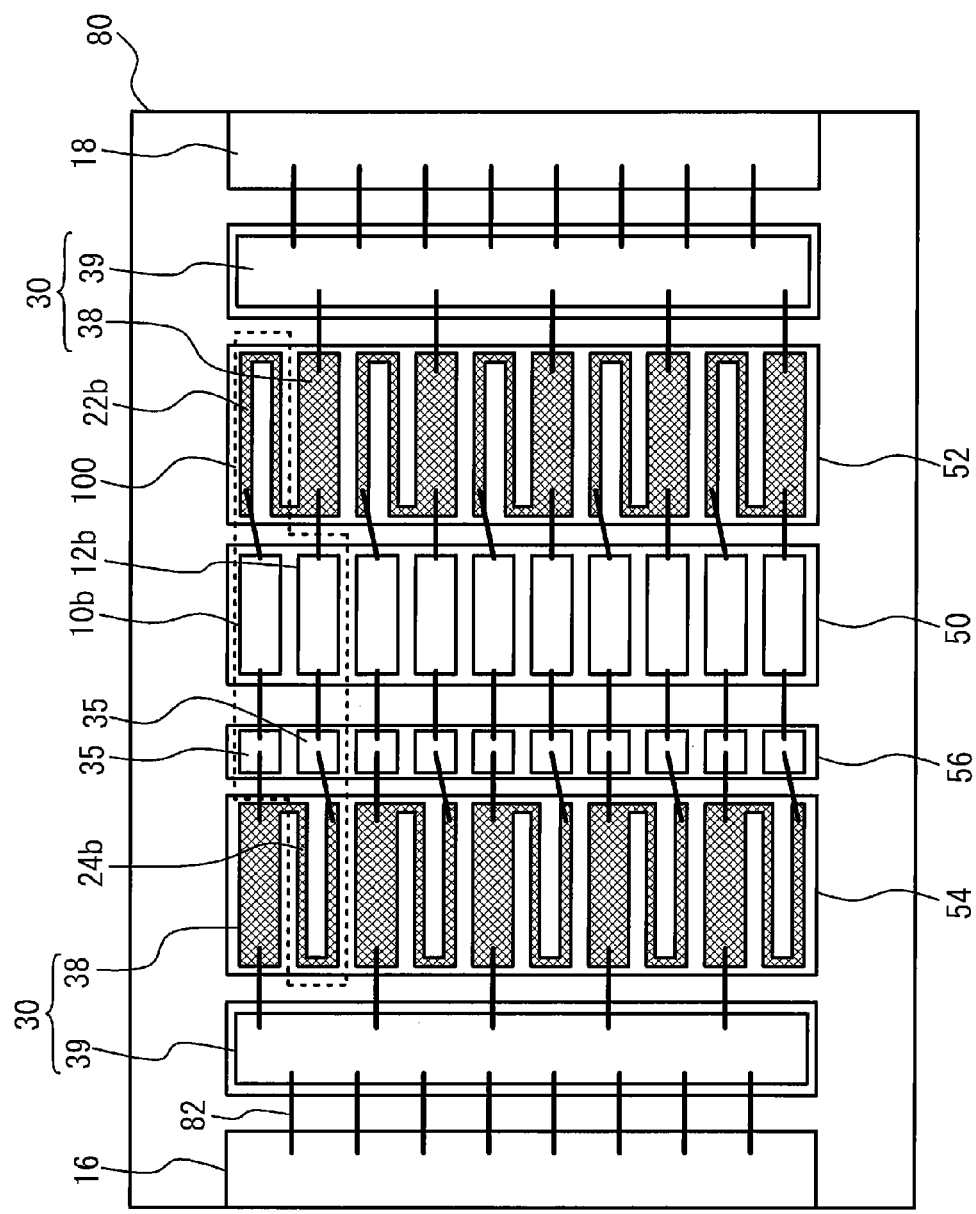
FIG. 6 is a plan view of a Doherty amplifier in accordance with a second embodiment.

A second embodiment is a Doherty amplifier having a specific configuration. FIG. 6 is a plan view of a Doherty amplifier in accordance with the second embodiment. Referring to FIG. 6, capacitors 39 and chips 50, 52, 54 and 56 are mounted on a package 80. A plurality of transmission lines 38 and a plurality of λ/4 phase lines 24b are formed on the chip 54. A plurality of bias circuits 35 are formed on the chip 56. The bias circuits 35 apply voltages to the gates of the carrier amplifiers 10b and those of the peaking amplifiers 12b. The carrier amplifiers 10b formed by GaN-based FETs and the peaking amplifiers 12b formed by GaN-based FETs are formed on the chip 50. The plurality of transmission lines 38 and the plurality of λ/4 phase lines 22b are formed on the chip 52. The chips are connected by bonding wires 82. The carrier amplifiers 10b, the peaking amplifiers 12b, the λ/4 phase lines 24b and 22b, and the bias circuits 35 form the Doherty circuits 100.

In each Doherty circuit 100, the input signal applied to the input terminal 16 is matched with the input impedances of the carrier amplifier 10b and the peaking amplifier 12b by the matching circuit 30 composed of the capacitor 39 and the transmission line 38. The input signal is distributed to the Doherty circuits 100 through the matching circuits 30. The impedance of the output terminal 18 is matched with the output impedance of the Doherty amplifier 102 by the matching circuits 30, each composed of the capacitor 39 and the transmission line 38. The output signals of the Doherty circuits 100 are combined through the matching circuits 30.

In the second embodiment, the λ/4 phase lines 24b and the transmission lines 38 are formed on the single chip 54, and the bias circuits 35 are formed on the single chip 56. The carrier amplifiers 10b and the peaking amplifiers 12b are formed on the single chip 50. The λ/4 phase lines 22b and the transmission lines 38 are formed on the single chip 52.

According to the second embodiment, the λ/4 phase lines 22b may be used as impedance transformers. Since the Doherty amplifier 102 is divided into the plurality of Doherty circuits 100, the λ/4 phase lines 22b may be formed by lines having a comparatively large characteristic impedance (approximately 20~100 Ω). It is thus possible to downsize the λ/4 phase lines 22b. The λ/4 phase lines 24b may also be downsized.

(Third Embodiment)

Figure 7:
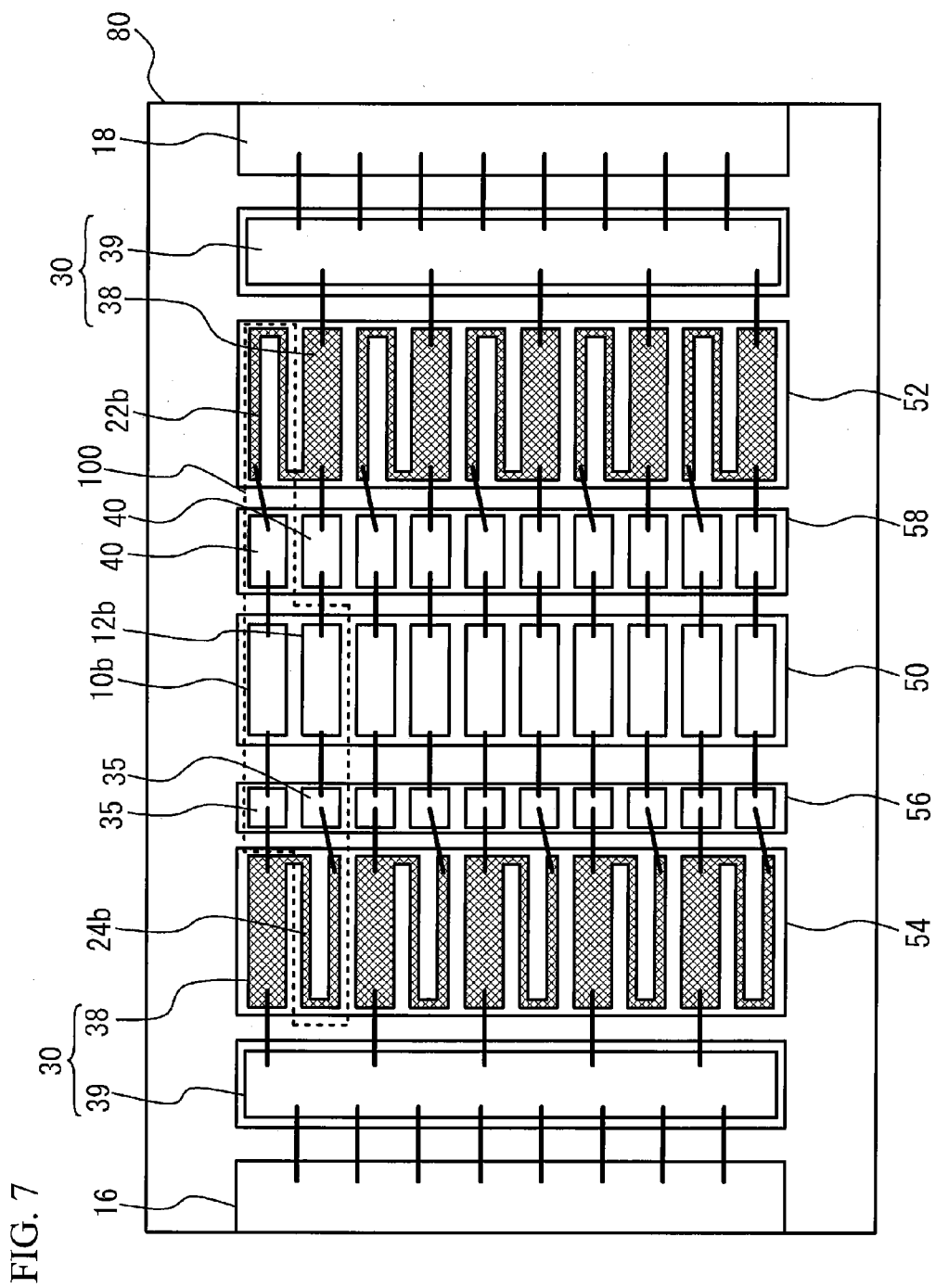
FIG. 7 is a plan view of a Doherty amplifier in accordance with a third embodiment.

FIG. 7 is a plan view of a Doherty amplifier in accordance with a third embodiment. Referring to FIG. 7, matching circuits 40 are provided at the next stages of the carrier amplifiers 10b and the peaking amplifiers 12b. The matching circuits 40 are formed on a single chip 58. The other structures of the third embodiment are the same as those of the second embodiment illustrated in FIG. 6. The matching circuits 40 convert the imaginary parts of the outputs of the carrier amplifiers 10b and the peaking amplifiers 12b to real parts. This conversion may be implemented by a small size of the matching circuits 40.

(Fourth Embodiment)

Figure 8:
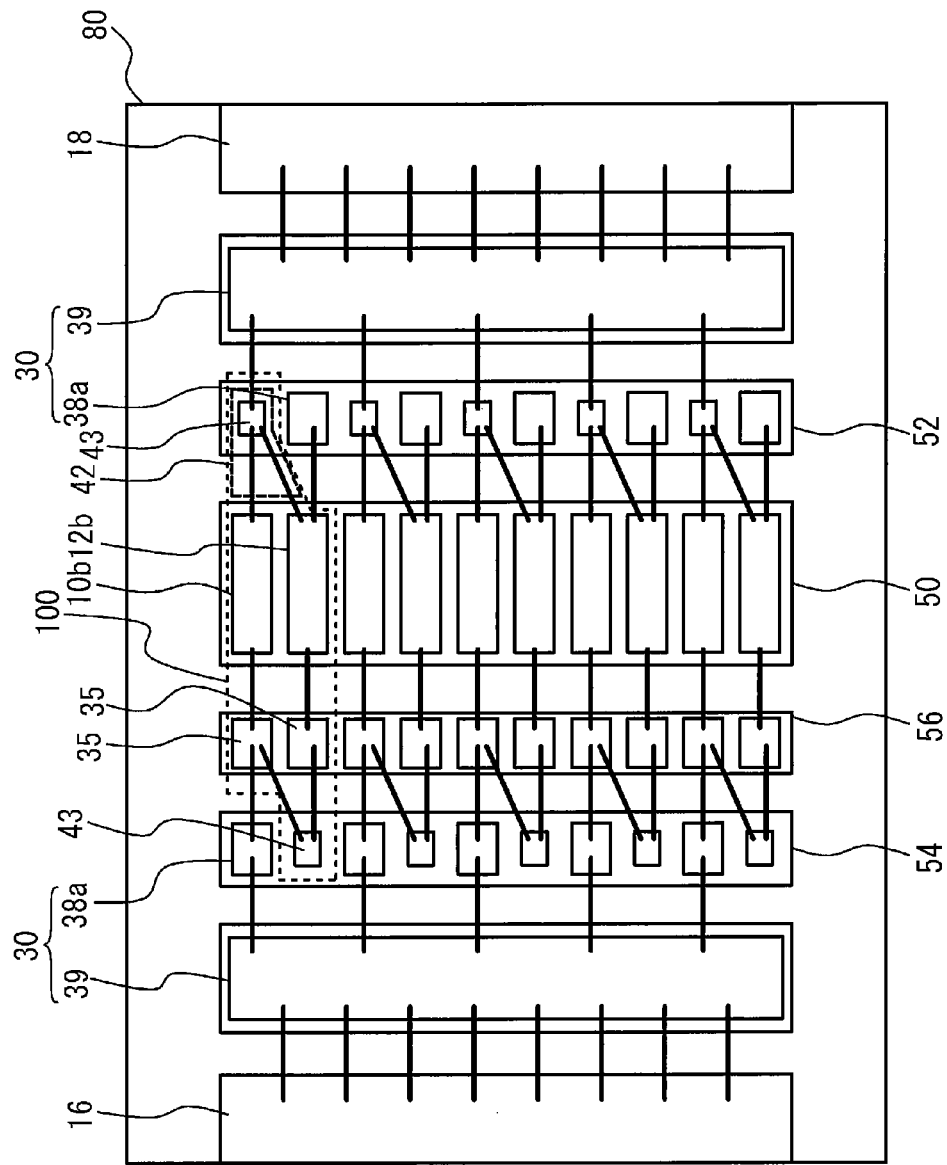
FIG. 8 is a plan view of a Doherty amplifier in accordance with a fourth embodiment.

A fourth embodiment is a Doherty amplifier in which T-type LC elements are substituted for the λ/4 phase lines as the impedance transformers. FIG. 8 is a plan view of the Doherty amplifier of the fourth embodiment. Referring to FIG. 8, a plurality of capacitors 43 and a plurality of lines 38a are formed on each of the chips 52 and 54. The capacitors 43 and the bonding wires 82 form T-type LC elements 42 (the impedance transformer). The other structures of the fourth embodiment are the same as those of the second embodiment illustrated in FIG. 6.

(Fifth Embodiment)

Figure 9:
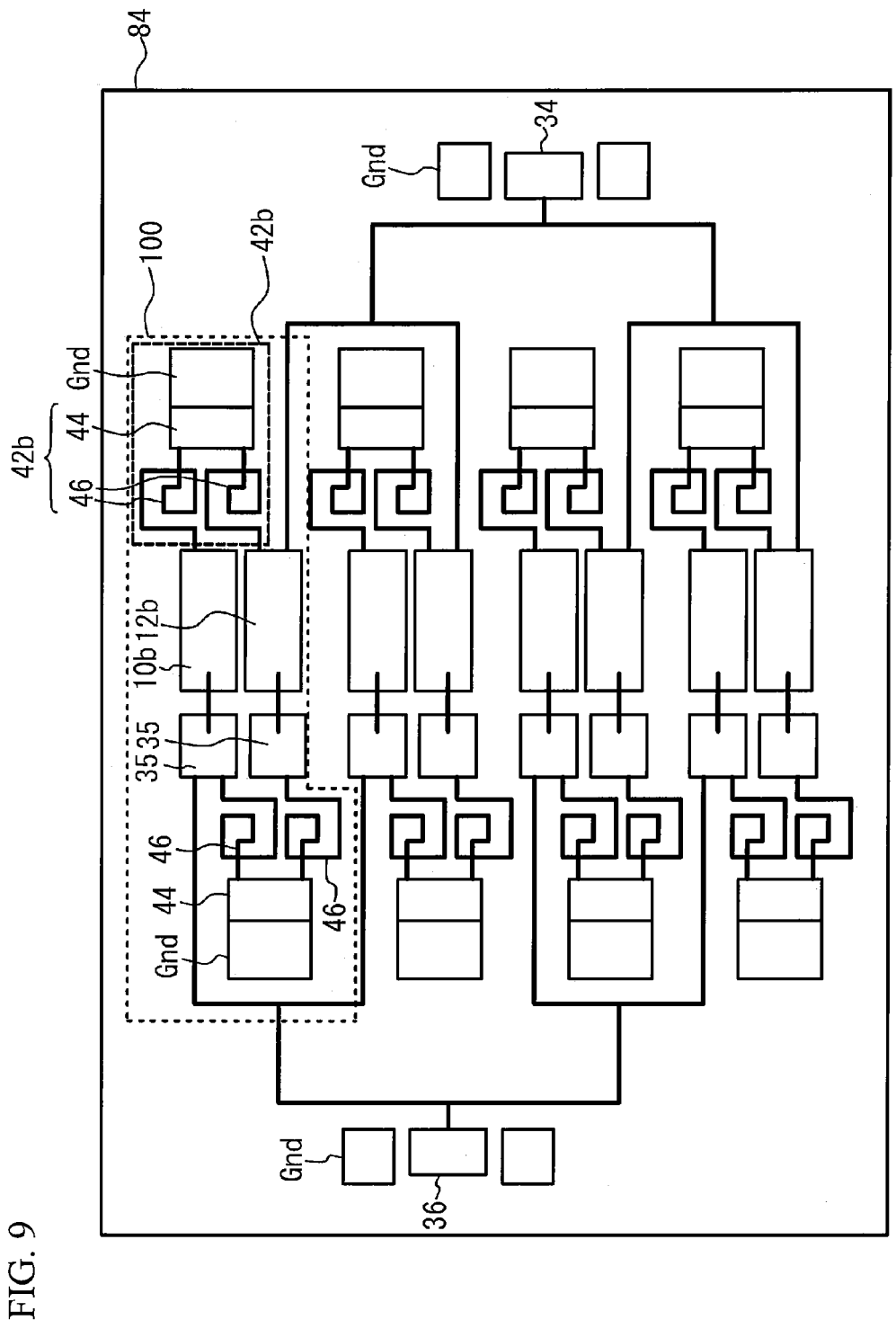
FIG. 9 is a plan view of a Doherty amplifier in accordance with a fifth embodiment.

A fifth embodiment is a Doherty amplifier using an MMIC (Microwave Monolithic Integrated Circuit). FIG. 9 is a plan view of the Doherty amplifier of the fifth embodiment. Referring to FIG. 9, the Doherty amplifier has the carrier amplifiers 10b, the peaking amplifiers 12b, the bias circuits 35, capacitors 44 and spiral inductors 46 on a substrate 84. The capacitors 44 and the spiral inductors 46 form T-type LC elements 42b. Electrodes Gnd have via holes for making connections with the backside of the substrate 84, and are thus grounded.

Figure 10A:
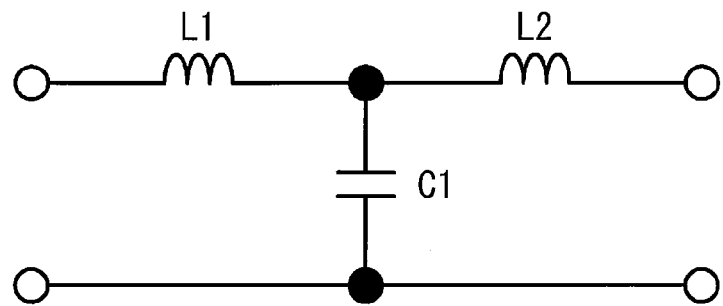
FIGS. 10A through 10D are circuit diagrams of a T-type LC element.
Figure 10B:
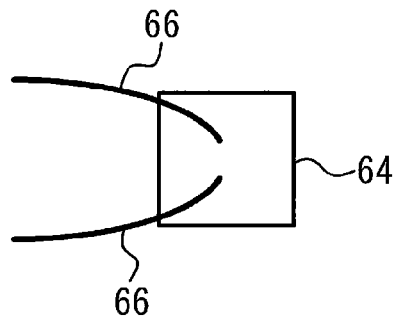
Figure 10C:
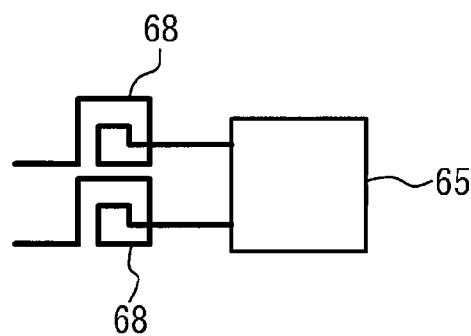
Figure 10D:
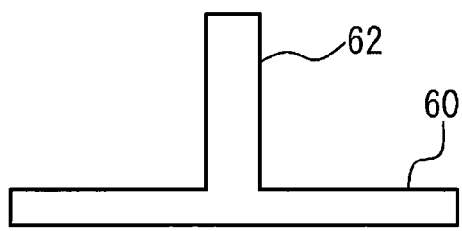

As in the cases of the fourth and fifth embodiments, the impedance transformers may be formed by T-type LC elements. FIGS. 10A through 10D illustrate exemplary T-type LC elements. Referring to FIG. 10A, the T-type LC element is configured to have inductors L1 and L2 connected in series between the input and the output, and a capacitor C1 connected in parallel. Referring to FIG. 10B, the T-type LC element may be formed by a capacitor 64, which may be a chip capacitor or an MIM (Metal Insulator Metal), and two bonding wires 66 connected to the capacitor 64. Referring to FIG. 10C, the T-type LC element may be formed by an MIM capacitor 65 and two spiral inductors 68 connected to the capacitor 65. Referring to FIG. 10D, the T-type LC element may be formed by an open stub 62 and two fine high-impedance lines 60 respectively connected on both sides of the open stub 62.

Figure 11A:
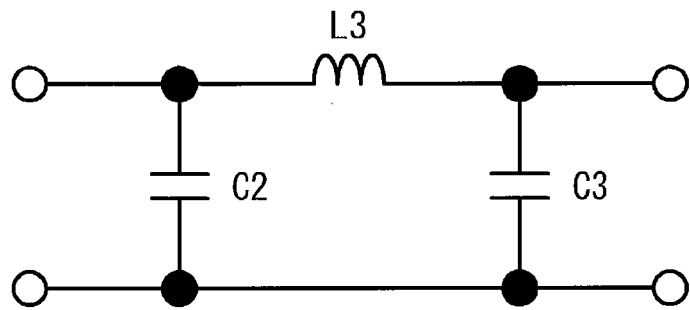
FIGS. 11A through 11D are circuit diagrams of a π-type LC element.
Figure 11B:
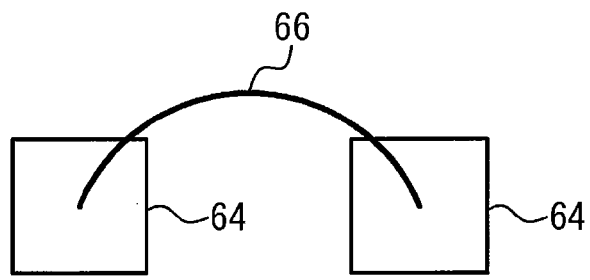
Figure 11C:
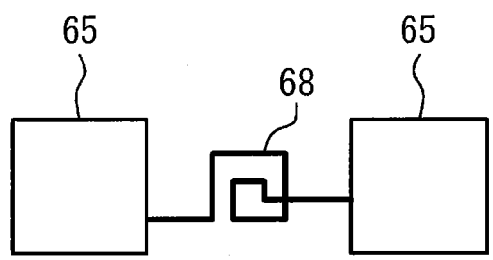
Figure 11D:
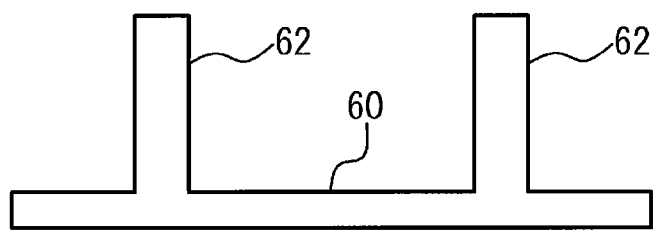

The impedance transformer may be formed by a π-type LC element. FIGS. 11A through 11D illustrate exemplary π-type LC elements. As illustrated in FIG. 11A, the π-type LC element is composed of an inductor L3 connected in series between the input and the output, and two capacitors C2 and C3 connected in parallel. Referring to FIG. 11B, the π-type LC element may be formed by two capacitors 64, which may be chip capacitors or MIM capacitors, and a bonding wire 66 connecting the two capacitors 64 together. Referring to FIG. 11C, the π-type LC element may be formed by two MIM capacitors 65 and one spiral inductor 68 connecting the two MIM capacitors 65 together. Referring to FIG. 11D, the π-type LC element may be formed by two open stubs 62 and a fine high-impedance line 60 connecting the two open stubs 62 together.

As in the cases of the fourth and fifth embodiments, the impedance transformer may be T-type or π-type LC element. Since the Doherty amplifier 102 is divided into the plurality of Doherty circuits 100, the T-type or π-type LC element may be downsized. Thus, the Doherty amplifier may be realized by the circuits integrated on the chip. The inductors may be formed by bonding wires. The T-type or π-type LC element may be formed by lumped-constant elements as illustrated in FIGS. 10B, 10C, 11B and 11C. It is also possible to use distributed-constant elements for the T-type or π-type LC elements, as illustrated in FIGS. 10D and 11D. The distributed-constant elements and the lumped-constant elements may be mixed.

As in the cases illustrated in FIGS. 6 and 7 in connection with of the second and third embodiments, the impedance transformers (for example, λ/4 phase lines 24b) of the plurality of Doherty circuits 100 may be formed on the single substrate (chip 54). It is thus possible to downsize the Doherty amplifier. The impedance transformers may be the T-type or π-type LC elements.

As illustrated in FIG. 9 in connection with the fifth embodiment, the plurality of Doherty circuits 100 are provided on the single chip (substrate 84), and the carrier amplifiers 10b and the peaking amplifiers 12b thereof are alternately arranged. It is thus possible to downsize the Doherty amplifier. As illustrated in FIG. 9, the plurality of Doherty circuits 100 and the impedance transformers (T-type LC elements 42b) are formed on the single chip. It is thus possible to downsize the Doherty amplifier. The impedance transformers may be the λ/4 phase lines or the T-type or π-type LC elements.

As illustrated in FIGS. 6 and 7 in connection with the second and fourth embodiments, the plurality of Doherty circuits 100 may be mounted on the single package 80. It is thus possible to downsize the Doherty amplifier.

The coupler 34 is not limited to the simple coupling but may be Wilkinson coupling, or a coupler using 90-degree hybrid or 180-degree hybrid.

The Doherty amplifier may be an asymmetric Doherty amplifier or a three-way Doherty amplifier, or an inverse Doherty amplifier.

The present invention is not limited to the specifically described embodiments, but may include various embodiments and variations within the scope of the claimed invention.

What is claimed is:

1. A Doherty amplifier comprising:
   an input distributor;
   a coupler;
   a plurality of Doherty circuits connected between the input distributor and the coupler, each of the plurality of Doherty circuits having a carrier amplifier, a peaking amplifier, a distributor distributing a input signal to the carrier amplifier and the peaking amplifier, and a combiner that transforms an output impedance of the carrier amplifier and combines outputs of the carrier amplifier and the peaking amplifier,
   wherein the carrier amplifier and the peaking amplifier of each of the plurality of Doherty circuits are integrated in a single semiconductor chip, and an output impedance of each of the carrier amplifier and the peaking amplifier is 20-100 Ω, and
   wherein the combiner of each of the plurality of Doherty circuits includes a line having a characteristic impedance of 20-100 Ω and is connected to the peaking amplifier and the carrier amplifier without impedance conversion,
   wherein the semiconductor chip and the combiner of each of the plurality of Doherty circuits are mounted in a package.

2. The Doherty amplifier according to claim 1, further comprising a matching circuit that is connected to the combiner and matches output impedances of the plurality of Doherty circuits with an output impedance of the Doherty amplifier.

3. The Doherty amplifier according to claim 2, wherein the output impedances of the plurality of Doherty circuits are higher than the output impedance of the Doherty amplifier.

4. The Doherty amplifier according to claim 1, wherein the combiner includes an impedance transformer that is connected to the carrier amplifier and transforms the output impedance of the carrier amplifier before the output of the carrier amplifier is combined with the output of the peaking amplifier.

5. The Doherty amplifier according to claim 4, wherein the impedance transformer is a λ/4 phase line where λ is a wavelength of an input signal of the input distributor.

6. The Doherty amplifier according to claim 4, wherein the impedance transformer is a T-type or π-type element.

7. The Doherty amplifier according to claim 1, wherein the impedance transformers of the plurality of Doherty circuits is formed on a single chip.

8. The Doherty amplifier according to claim 1, wherein the plurality of Doherty circuits and the impedance transformers of the plurality of Doherty circuits are formed on a single chip.

9. The Doherty amplifier according to claim 1, wherein the plurality of Doherty circuits is mounted on a single package.

10. The Doherty amplifier according to claim 1, further comprising a matching circuit that is connected to an input of the distributor of each Doherty circuits, wherein the matching circuit matches input impedances of the plurality of Doherty circuits with an input impedance of the Doherty amplifier.

11. The Doherty amplifier according to claim 1, further comprising a phase compensator connected between the distributor and the peaking amplifier.

12. The Doherty amplifier according to claim 4, wherein the impedance transformer is formed by a capacitor and bonding wires.

13. The Doherty amplifier according to claim 4, wherein the impedance transformer is formed by an open stub.

14. The Doherty amplifier according to claim 4, wherein the impedance transformer is formed by a spiral inductor and a capacitor.

* * * * *

UNITED STATES PATENT AND TRADEMARK OFFICE
CERTIFICATE OF CORRECTION

PATENT NO. : 8,581,665 B2
APPLICATION NO. : 13/191043
DATED : November 12, 2013
INVENTOR(S) : Norihiko Ui Page 1 of 1

It is certified that error appears in the above-identified patent and that said Letters Patent is hereby corrected as shown below:

On the title page
Change

"(73) Assignee: Sumitomi Electric Device Innovations, Inc., Yokohama-shi, Kanagawa (JP)"

To Be

--(73) Assignee: Sumitomo Electric Device Innovations, Inc., Yokohama-shi, Kanagawa (JP)--

Signed and Sealed this
Twenty-fifth Day of March, 2014

Michelle K. Lee
*Deputy Director of the United States Patent and Trademark Office*